(12) United States Patent
Ido et al.

(10) Patent No.: US 6,339,250 B1
(45) Date of Patent: Jan. 15, 2002

(54) SEMICONDUCTOR DEVICE

(75) Inventors: Yasuhiro Ido; Takeshi Iwamoto; Rui Toyota, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/213,288

(22) Filed: Dec. 17, 1998

(30) Foreign Application Priority Data

Jul. 6, 1998 (JP) ............................................ 10-190583

(51) Int. Cl.[7] .................... H01L 21/425; H01L 21/31
(52) U.S. Cl. ...................... 257/529; 257/50; 257/530; 257/768
(58) Field of Search ....................... 257/50, 529, 530; 257/768; 438/601, 540

(56) References Cited

U.S. PATENT DOCUMENTS

| | | | | |
|---|---|---|---|---|
| 5,627,400 A | * | 5/1997 | Koga | 257/529 |
| 5,712,206 A | * | 1/1998 | Chen | 438/601 |

FOREIGN PATENT DOCUMENTS

| | | | | |
|---|---|---|---|---|
| JP | 60-76140 | * | 4/1985 | 257/48 |
| JP | 60-53048 | | 5/1985 | |
| JP | 60-84835 | | 5/1985 | |
| JP | 61-22650 | | 1/1986 | |
| JP | 1-33333 | | 5/1989 | |
| JP | 05-041481 | | 2/1993 | |
| JP | 07-153910 | | 6/1995 | |
| JP | 9-298244 | | 11/1997 | |

* cited by examiner

Primary Examiner—Olik Chaudhuri
Assistant Examiner—Shrinivas H. Rao
(74) Attorney, Agent, or Firm—McDermott, Will & Emery

(57) ABSTRACT

On a silicon substrate, silicon oxide film is formed. On the silicon oxide film, a BPSG film is formed. On the BPSG film, a silicon oxide film which does not include at least phosphorus and has a thickness equal to or more than about 1 μm is formed as a protective film. On the silicon film, a fuse is formed. Covering the fuse, a silicon oxide film which does not include at least phosphorus is formed on the silicon oxide film. Thus, the corrosion of the fuse is prevented, whereby a semiconductor device with highly reliable metal interconnection can be obtained.

5 Claims, 6 Drawing Sheets

SEMICONDUCTOR DEVICE

BACKGROUND OF THE INVENTION

1. Field of the Invention

The present invention relates to a semiconductor device, and more particularly to a semiconductor device with a fuse.

2. Description of the Background Art

An example of a conventional semiconductor device will be described. In a semiconductor memory device having a plurality of memory cells on a semiconductor substrate, for example, in addition to originally required regular memory cells, spare memory cells are formed in its memory cell region. When a particular memory cell does not function as a memory cell because of a foreign particle attached to the semiconductor substrate, for example, during a manufacturing process of the semiconductor device, this defective memory cell is replaced with a spare memory cell. In order to achieve this function, a switching circuit is formed on the semiconductor substrate.

A defective memory cell is detected by a tester during the manufacturing process of the semiconductor device. For the replacement of the detected defective memory cell with a spare memory cell, a programming of the switching circuit is performed by blowing a fuse for redundant circuit programming (hereinafter simply referred to as "fuse") placed in the switching circuit, by a laser beam. When the address of the defective memory cell is selected, the programmed switching circuit switches to select the spare memory cell.

FIGS. 8 and 9 show respectively a sectional view and a plan view near the fuse in the switching circuit. With reference to FIGS. 8 and 9, on a silicon substrate 101, a silicon oxide film 102 is formed such that it covers a switching transistor (not shown) and so on formed in the memory cell region. On silicon oxide film 102, a BPSG (Boro-Phospho-Silicate-Glass) film 103 is formed such that it covers a capacitor and a bit line (neither is shown), for example, in the memory cell region. On BPSG film 103, a metal interconnection 104 of aluminum, for example, is formed with a fuse 104a. A silicon oxide film 105 is formed on BPSG film 103 such that it covers metal interconnection 104. Further on silicon oxide film 105, a passivation film 106 is formed from a silicon nitride film, for example. An area around the fuse of the conventional semiconductor device is configured in this manner.

As mentioned above, a certain fuse is blown by a laser beam during the manufacturing process, especially in the laser trimming process, in order to replace a defective memory cell with a spare memory cell. The fuse covered with silicon oxide film 105 is irradiated with laser beam. Then the fuse is liquefied, vaporized and explodes. As a result, fuse 104a is blown as shown in FIG. 10. In the portion of the blown fuse, a hole 107 made by the explosion reaches BPSG film 103.

The conventional semiconductor device with a metal fuse has been suffered from a following problem. After the fuse is blown by the laser beam, entrance of moisture into blown portion is prevented by coating the blown portion with a silicon nitride film, a polyimide film or the like. In this case, however, the silicon nitride film or the like must newly be formed on a surface of a wafer after blowing the fuse.

On the other hand if the blown portion of the fuse is not covered with the silicon nitride film, for example, moisture, which enters from the blown portion, corrodes an end portion of the blown fuse. Especially because the fuse is formed on BPSG film 103, as shown in FIG. 10, phosphorus included in BPSG film 103 reacts with moisture and easily forms phosphoric acid ($H_3PO_4$). Phosphoric acid produced in this manner sometimes accelerates the corrosion of the blown fuse made of aluminum. Thus, a corrosion 108 proceeds from the end portion of the fuse, thereby degrading the reliability of the metal interconnection.

An object of the present invention is to obtain a semiconductor device with a highly reliable metal interconnection by suppressing the corrosion of the fuse.

SUMMARY OF THE INVENTION

In accordance with one aspect of the present invention, a semiconductor device includes a semiconductor substrate, a first insulation film, a fuse, a second insulation film and a protective film. The semiconductor substrate has a main surface. The first insulation film, formed on the main surface of the semiconductor substrate, includes a prescribed impurity which forms a compound through the reaction with moisture. The fuse formed on the first insulation film is made of a metal. The second insulation film, which is formed such that it covers the fuse, does not include the prescribed impurity. The protective film, posed between the first insulation film and the fuse, does not include the prescribed impurity and prevents the hole formed at the fuse blow from reaching the first insulation film.

In this structure, the protective film is formed between the first insulation film and the fuse. Thus, the hole formed at the fuse blow is prevented from reaching the first insulation film, whereby the corrosion of the metal fuse induced by an oxide formed through the reaction with moisture can be prevented. In addition, as the fuse is covered with the second insulation film, which does not include the prescribed impurity, the formation of the oxide through the reaction with moisture can be prevented, that further prevents the corrosion of the fuse. As a result, the reliability of the interconnection of the semiconductor device with the fuse is improved.

The protective film preferably includes a third insulation film, which does not include the prescribed impurity. The thickness of the third insulation film is desirably equal to or more than 1 $\mu$m. Then the hole formed at the fuse blow can be effectively prevented from reaching the first insulation film.

Still preferably, an additional metal interconnection is included in a different layer from the interconnection with the fuse, and the protective film includes a metal film formed at the same time with the additional metal interconnection and not electrically connected with the additional metal interconnection.

In this case, the protective film can be formed from the same layer at the same time with the additional metal interconnection without an additional process step. In addition, the hole formed at the fuse blow can be prevented from reaching the first insulation film by the protective film with smaller thickness.

In accordance with another aspect of the present invention, the semiconductor device, including a fuse formed on a semiconductor substrate, includes a pair of voltage detection units, a voltage comparison unit and a pair of voltage applying units. Of the pair of voltage detection units, one is electrically connected with one end of the fuse, and another is electrically connected with another end of the fuse thereby detecting voltages at one end and another end of the fuse, respectively. The voltage comparison unit is electrically connected with the pair of voltage detection units and compares the voltages at one end and another end of the fuse. Of the pair of voltage applying units, both electrically connected with the voltage detection units, one is electrically connected with one end of the fuse and another is electrically connected with another end of the fuse. The voltage applying units apply a voltage after the fuse blow so that there will be no potential difference between one end and another end of the fuse.

In this structure, the voltages at the ends of the blown fuse are detected by the pair of voltage detection units, respectively. The detected voltages are compared in the voltage comparison unit. When the voltage comparison unit detects a voltage difference between two ends of the blown fuse, the voltage applying units apply a voltage so that there will be no potential difference between one end and another end of the blown fuse. Therefore, the advance of an electric or a chemical reaction caused by the potential difference between two ends of the blown fuse is suppressed, whereby the progress of the corrosion of the fuse portion can effectively be suppressed. As a result, the reliability of the interconnection of the semiconductor device is improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
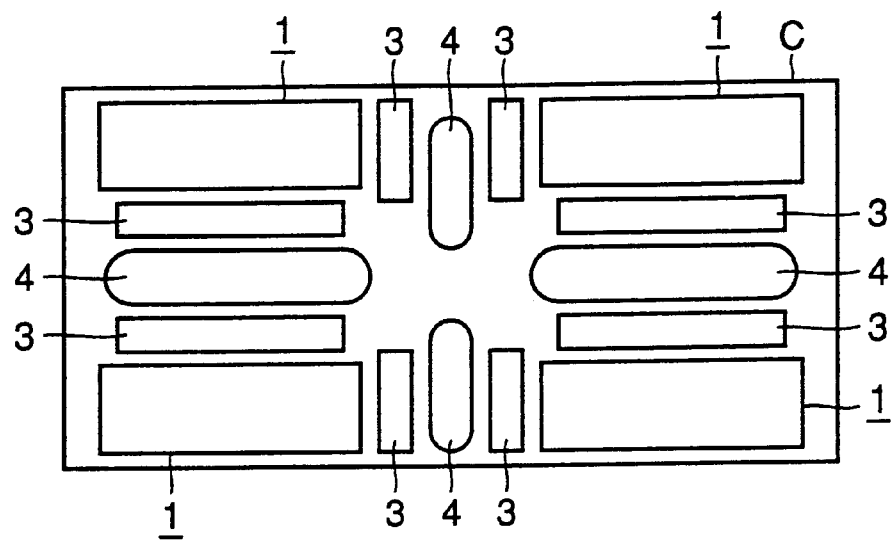
FIG. 1 shows an overall configuration of a semiconductor device in accordance with a first embodiment of the present invention.
Figure 2:
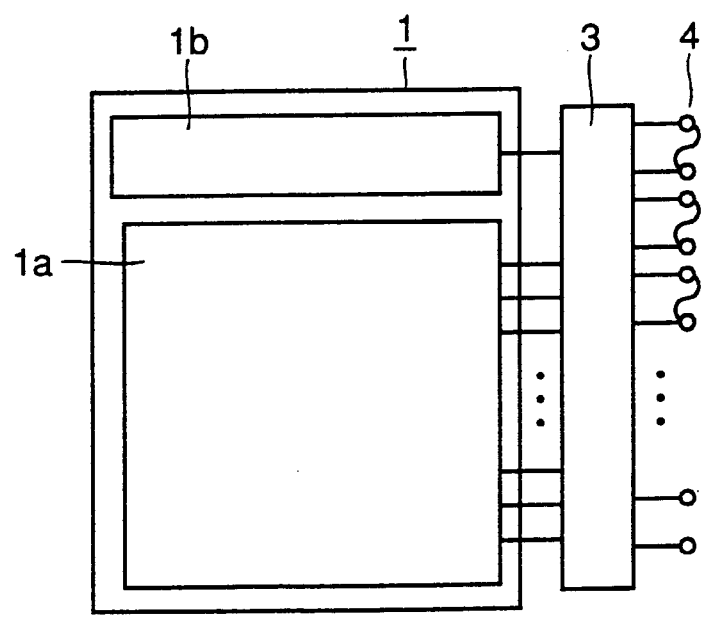
FIG. 2 shows a configuration of a main portion of the semiconductor device in accordance with the first embodiment shown in FIG. 1.

The semiconductor device in accordance with the first embodiment of the present invention will be described referring to the drawings. FIG. 1 shows an example of an overall configuration of a semiconductor device with a fuse on a semiconductor chip C and FIG. 2 shows a main portion thereof. As is shown in FIGS. 1 and 2, memory cells 1 having main memory cells 1a and spare memory cells 1b are formed on semiconductor chip C. A switching circuit 3 is formed in order to replace a defective memory cell with a memory cell among spare memory cells 1b when the defective memory cell is found among main memory cells 1a. A fuse portion 4 is formed in order to program switching circuit 3. Fuse portion 4 includes a plurality of fuses.

Figure 3:
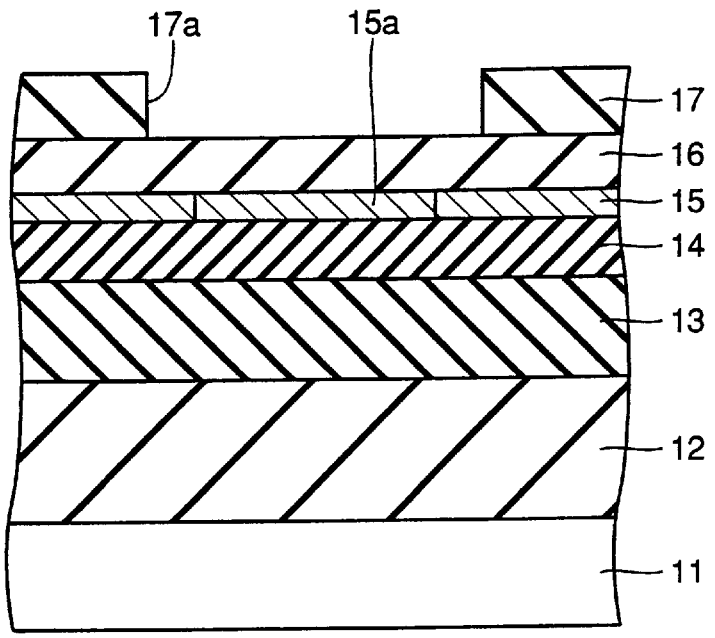
FIG. 3 shows a cross sectional view near the fuse in accordance with the first embodiment.
Figure 4:
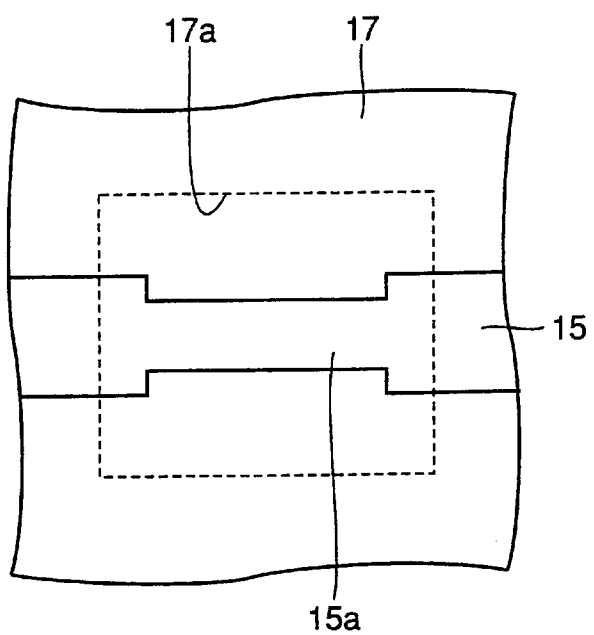
FIG. 4 shows a plan view near the fuse in accordance with the first embodiment.

FIG. 3 shows an example of a cross section near the fuse in the semiconductor device having a two layered structure of metal interconnection and FIG. 4 shows a plan view thereof In FIG. 3, an upper layer metal interconnection is not shown. As shown in FIGS. 3 and 4, a silicon oxide film 12 is formed on a silicon substrate 11 such that it covers a transistor (not shown) in the memory cell region. A BPSG film 13 is formed on silicon oxide film 12 such that it covers a capacitor or a bit line (neither is shown), for example, in the memory cell region. The BPSG film is generally caused to reflow by a heat treatment to planalize a wafer surface. In a semiconductor device of which the miniaturization is required, the BPSG film is used as an underlying film of the metal interconnection in order to improve the processing precision of the metal interconnection. A silicon oxide film 14 is formed as a protective film on BPSG film 13. A film other than the one including at least phosphorus as impurity, such as BPSG film or PSG film, is used as silicon oxide film 14. The thickness of silicon oxide film 14 is desirably equal to or more than about 1 $\mu$m.

A metal interconnection 15 of aluminum, for example, with a fuse 15a is formed on silicon oxide film 14. A silicon oxide film 16 with a thickness from about 0.6 to 1.0 $\mu$m is formed such that it covers metal interconnection 15. A passivation film 17 with a thickness of about 9 $\mu$m is formed from e.g. a silicon nitride film on silicon oxide film 16. An opening 17a is formed in passivation film 17 in a region corresponding to the location of fuse 15a. When opening 17a is not formed in passivation film 17, fuse 15a cannot be blown by a laser beam. Thus the semiconductor device in accordance with the first embodiment is formed.

As was mentioned in the description of the background art, when a defective memory cell is detected among main memory cells 1a by the tester, the defective memory cell is replaced with a memory cell among spare memory cells 1b during the laser trimming process. A certain fuse is blown for this replacement. The fuse is blown by the irradiation of laser beam at a region where the fuse is placed.

Figure 5:
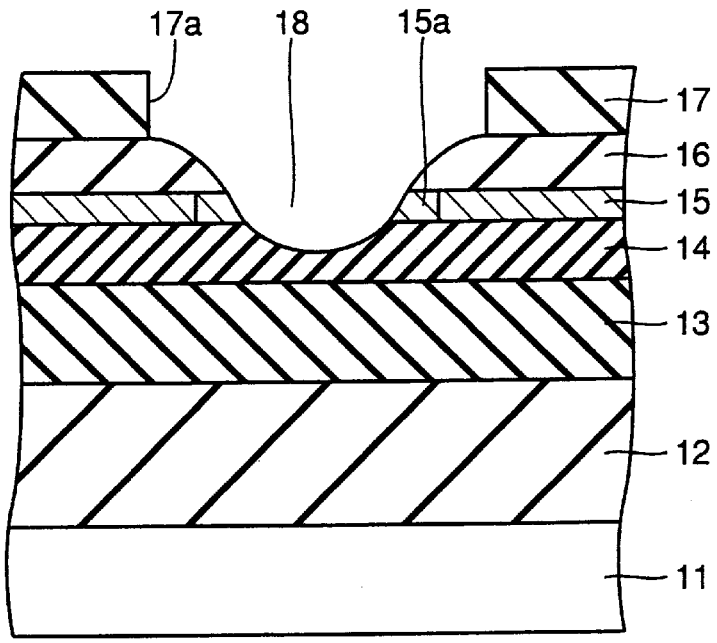
FIG. 5 shows a cross sectional view near the fuse in accordance with the first embodiment after the fuse is blown.

As can be seen from FIG. 5, when the fuse is irradiated with the laser beam, fuse 15a is liquefied, vaporized and then explodes because of the heat. Then at the explosion of fuse 15a, a hole 18 is formed. Here, silicon oxide film 14 is formed beneath fuse 15a as a protective film. As silicon oxide film 14 has a thickness equal to or more than about lam, it can prevent hole 18 from reaching BPSG film 13 formed beneath silicon oxide film 14. Thus even after the blow of fuse 15a, BPSG film 13 will not be exposed. In addition, metal interconnection 15 with fuse 15a is covered with silicon oxide film 16, which does not include at least phosphorus.

Therefore, even if moisture enters the portion of the blown fuse, a reaction of moisture with phosphorus, and thus the formation of phosphoric acid can be prevented. As a result, the proceeding of the corrosion of the portion of fuse 15a which has been blown, and the corrosion of metal interconnection 15 can be suppressed. Further, this eliminates the need for a nitride film, for example, for covering the portion of fuse 15a which has been blown, for the prevention of moisture entrance. Thus, the corrosion of the blown fuse in the semiconductor device, and therefore the corrosion of the metal interconnection can effectively be prevented, whereby the reliability of the interconnection can be improved.

In this example, the thickness of silicon oxide film 14 formed beneath fuse 15a as a protective film is made equal to or more than 1 $\mu$m. The thickness, however, is desirably selected depending on a depth of a hole produced at the fuse blow and on the range of moisture permeation. In addition, though in this example the metal interconnection is of a two layered structure, the present invention can also be applied to a single layered structure.

Second Embodiment

Figure 6:
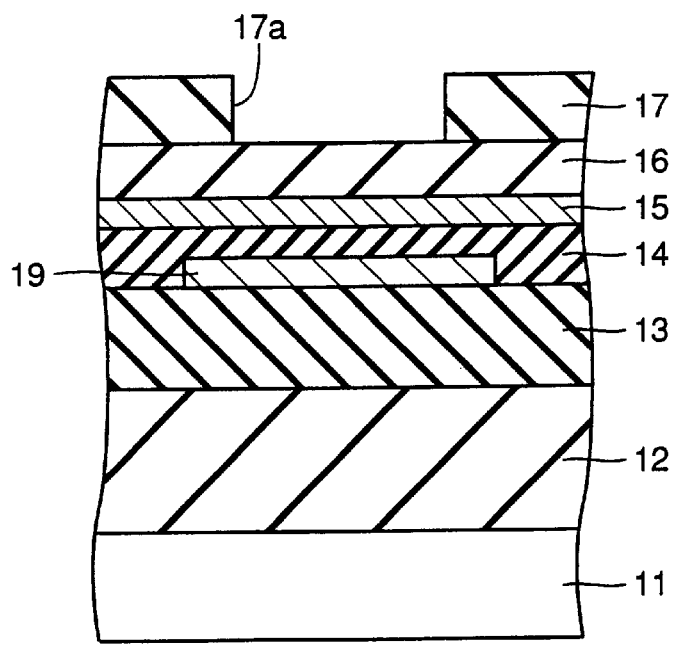
FIG. 6 shows a cross sectional view near a fuse of a semiconductor device in accordance with a second embodiment of the present invention.

In the first embodiment, a silicon oxide film is used as a protective film as an example. In the second embodiment, the protective film includes a metal film. FIG. 6 shows a cross section near the fuse of the semiconductor device having a metal interconnection including three or more layers. In FIG. 6, the third and the following layers from the bottom are not shown.

With reference to FIG. 6, a metal film 19 is formed as a protective film on BPSG film 13. Metal film 19 is formed at the same time with the formation of the first metal interconnection from the same layer with the first metal interconnection. In addition, metal film 19 is electrically insulated from and separated from the original first metal interconnection. Silicon oxide film 14 is formed such that it covers metal film 19. Metal interconnection 15 with fuse 15a is formed as a second metal interconnection on silicon oxide film 14. The other portion of structure shown in FIG. 6 not mentioned above is the same with the structure of the semiconductor device shown in FIG. 3.

In addition to the advantages which can be obtained in the first embodiment, in the semiconductor device in accordance with the second embodiment, because of metal film 19 included in the protective film, the hole generated at the fuse blow can be prevented from reaching BPSG film 13 using a thinner protective film than the protective film which includes a silicon oxide film alone. In addition, as metal film 19 is formed at the same time with the formation of the first metal interconnection, an additional step is not required.

The fuse must be covered with a silicon oxide film when it is blown by the explosion. Therefore it is desirable in a multilayer metal interconnection structure, to use a metal interconnection one layer lower than the upper most layer as a metal interconnection with a fuse. Further it is desirable to place a metal film which is formed at the same time and from the same layer with a metal interconnection one layer lower than the metal interconnection with the fuse, below the metal interconnection with the fuse as a protective film.

Third Embodiment

Figure 7:
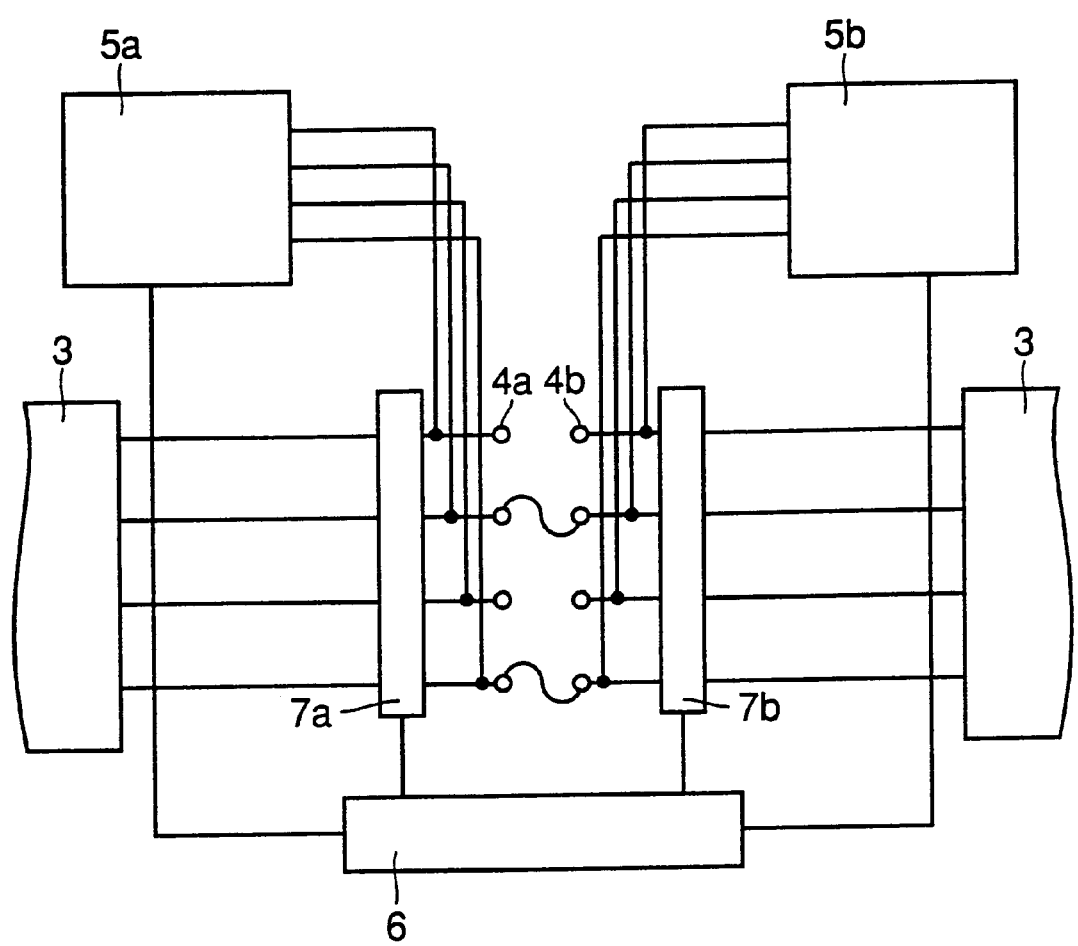
FIG. 7 shows a configuration of a control circuit of a semiconductor device in accordance with a third embodiment of the present invention.
Figure 8:
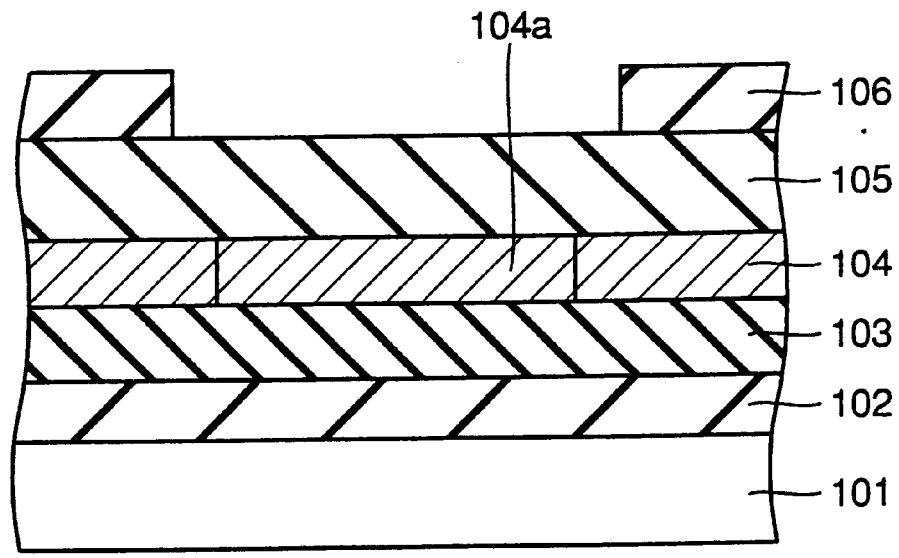
FIG. 8 shows a cross sectional view near the fuse of the conventional semiconductor device.
Figure 9:
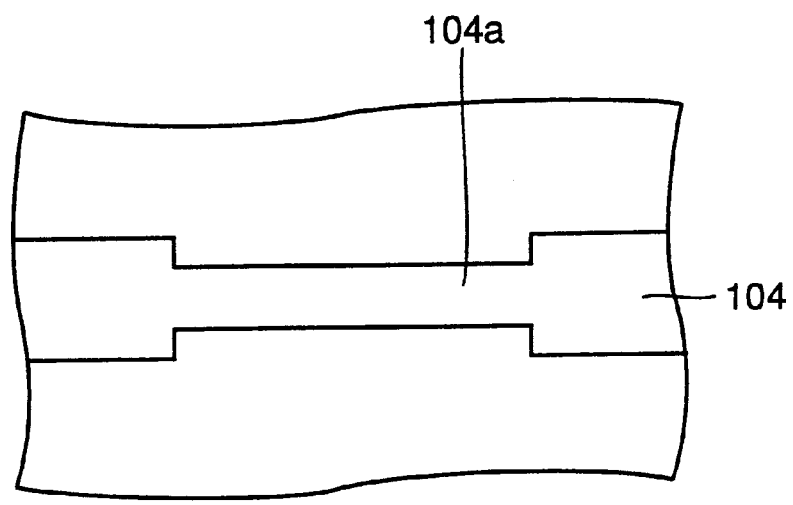
FIG. 9 shows a plan view near the fuse of the conventional semiconductor device.
Figure 10:
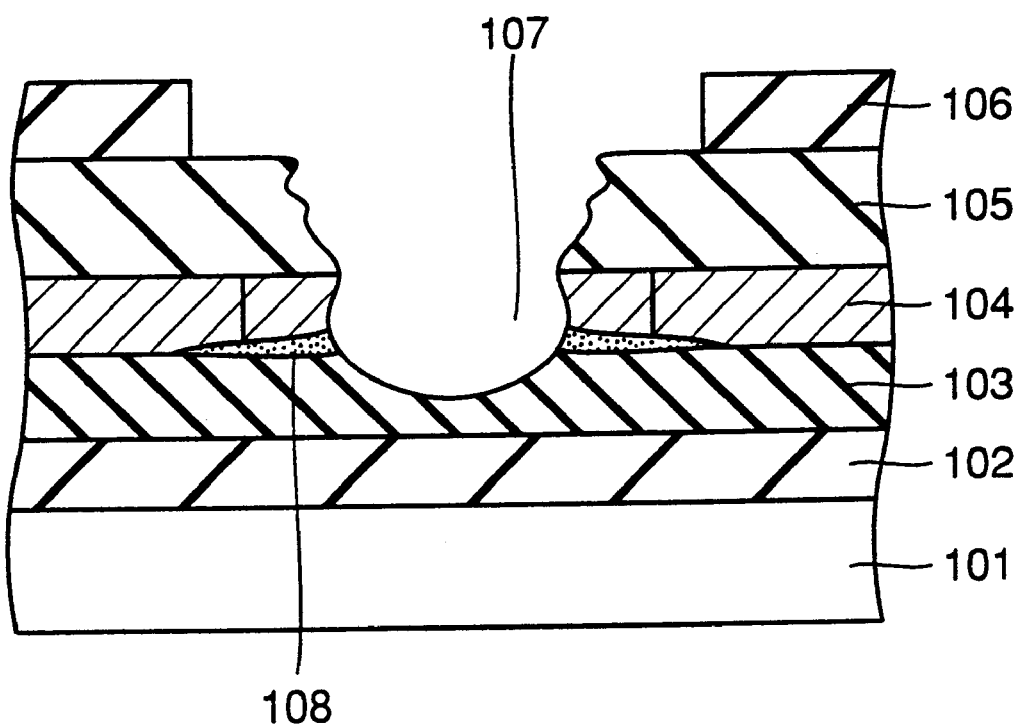
FIG. 10 is a cross sectional view near the fuse of the conventional semiconductor device after the fuse is blown.

When the potential difference is generated between the ends of blown fuse 15a shown in and described with reference to FIG. 5 in accordance with the first embodiment, the corrosion of metal interconnection 15 may proceed by the accelerated reaction of entering moisture with aluminum included in the ends of fuse 15a. In this third embodiment, the semiconductor device with the control circuit for preventing generation of the potential difference between the ends of the blown fuse will be described. FIG. 7 is a block diagram showing the configuration of the control circuit.

As can be seen from FIG. 7, the control circuit includes a pair of voltage detection units 5a and 5b, a voltage comparison unit 6 and a pair of voltage applying units 7a and 7b. In the pair of voltage detection units 5a and 5b, one voltage detection unit 5a is electrically connected with one end 4a, for example, of the fuse and another voltage detection unit 5b is electrically connected with another end 4b, for example, of the fuse. Information about the voltages detected at both voltage detection units 5a and 5b are delivered to voltage comparison unit 6, which compares the voltages at the ends of the fuse. When the potential difference exists between two ends of the fuse, the information is delivered to voltage applying units 7a and 7b, which apply an appropriate voltage on ends 4a and 4b, for example, of the fuse to prevent the generation of potential difference between the ends of the fuse.

In the semiconductor device with the control circuit described above, the potential difference will not be generated between the ends of the blown fuse. Thus the reaction of aluminum included in the ends of the blown fuse with moisture is suppressed, whereby the corrosion of the metal interconnection is suppressed. In addition, when this control circuit is applied into the conventional semiconductor device, the corrosion of the metal interconnection by phosphoric acid, for example, can effectively be suppressed. As a result, the reliability of the metal interconnection of the semiconductor device is significantly improved.

Though in this embodiment, the silicon oxide film, which does not include at least phosphorus, is used as silicon oxide film 16 which covers silicon oxide film 14 (protective film) and the fuse, as an example, as far as a film does not include any impurity which reacts with moisture and forms a compound promoting the corrosion of the metal interconnection, other films can be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a semiconductor substrate having a main surface;
    a first insulation film formed over the main surface of said semiconductor substrate and including a prescribed impurity which reacts with moisture and forms a compound;
    a fuse of metal formed over said first insulation film;
    a second insulation film formed such that it covers said fuse and being free from said prescribed impurity; and
    a protective film of a single layer posed between said first insulation film and said fuse for preventing a hole formed when said fuse is blown from reaching said first insulation film, and being free from said prescribed impurity.

2. The semiconductor device according to claim 1, wherein said protective film includes a third insulation film being free from said prescribed impurity.

3. The semiconductor device according to claim 2, wherein said third insulation film is at least 1 μm in thickness.

4. The semiconductor device according to claim 1, further comprising another metal interconnection in a layer different from the interconnection with said fuse, wherein
    said protective film includes a metal film which is formed at the same time with said another metal interconnection and is not electrically connected with said another metal interconnection.

5. The semiconductor device according to claim 2, further comprising another metal interconnection in a layer different from the interconnection with said fuse, wherein
    said protective film includes a metal film which is formed at the same time with said another metal interconnection and is not electrically connected with said another metal interconnection.

* * * * *